METHOD OF MAKING INTEGRATED CIRCUITS WITH COMPLEMENTARY ELEMENTS

Filed Aug. 16, 1968 2 Sheets-Sheet 1

INVENTORS
WILHELM H. LEGAT
ALAN F. DIXON
BY [signature]
AGENT

INVENTORS
WILHELM H. LEGAT
ALAN F. DIXON
BY [signature]
AGENT 3,514,845

METHOD OF MAKING INTEGRATED CIRCUITS WITH COMPLEMENTARY ELEMENTS

Wilhelm H. Legat, Woodside, Calif., and Alan F. Dixon, Andover, Mass., assignors to Raytheon Company, Lexington, Mass., a corporation of Delaware

Filed Aug. 16, 1968, Ser. No. 753,119

**Int. Cl. H01l *11/14***

U.S. Cl. 29—571 2 Claims

ABSTRACT OF THE DISCLOSURE

A semiconductor device which comprises a number of complementary metal-oxide-silicon transistors, such as the field-effect type, in a single integrated circuit, and method of making such a device wherein a semiconductor substrate is oriented in a preferred direction and etched to provide cavities having sides substantially identical profiles. The cavities are then filled in with single crystal material of opposite conductivity.

BACKGROUND OF THE INVENTION

Integrated circuits of a conventional nature employ a number of devices formed on a single silicon chip. However, such circuits are relatively difficult to fabricate, particularly when it is desired that several complementary devices, such as field-effect transistors, be fabricated on a single chip since such complementary devices must possess substantially identical shapes and sizes as will provide similar electrical characteristics. In the fabrication of such integrated circuit devices by known methods, the discrete units or complementary devices are generally etched to the desired shapes and sizes with conventional acids or with hydrochloric gas in a furnace. The resultant devices of the prior art art not precisely defined because such etching techniques are not accurate and cannot lead to precise definition of the P-type and N-type areas as is required to fabricate truly complementary devices.

SUMMARY OF THE INVENTION

The present invention relates primarily to an integrated circuit device which includes a plurality of complementary metal-oxide-silicon field-effect transistors, and to a novel method of making such devices whereby the individual transistors will be truly complementary. Such method includes the steps of etching a silicon wafer of one conductivity type in the 1–0–0 crystallographic orientation by first masking the wafer with the masking being precisely oriented with respect to the 1–1–0 direction of the wafer, and then subjecting the masked wafer to a solution of sodium hydroxide or other selected etchant to etch the wafer substantially along the 1–0–0 planes, followed by epitaxially depositing a controlled resistivity area of opposite conductivity within the etched areas. These specific process steps in combination with other conventional steps has produced high quality complementary units on a single silicon chip.

BRIEF DESCRIPTION OF THE DRAWINGS

Other objectives and advantages of this invention will become apparent from the following description taken in connection with the accompanying drawings, wherein.

DESCRIPTION OF THE PREFERRED EMBODIMENTS

Figures 1, 2, 3:
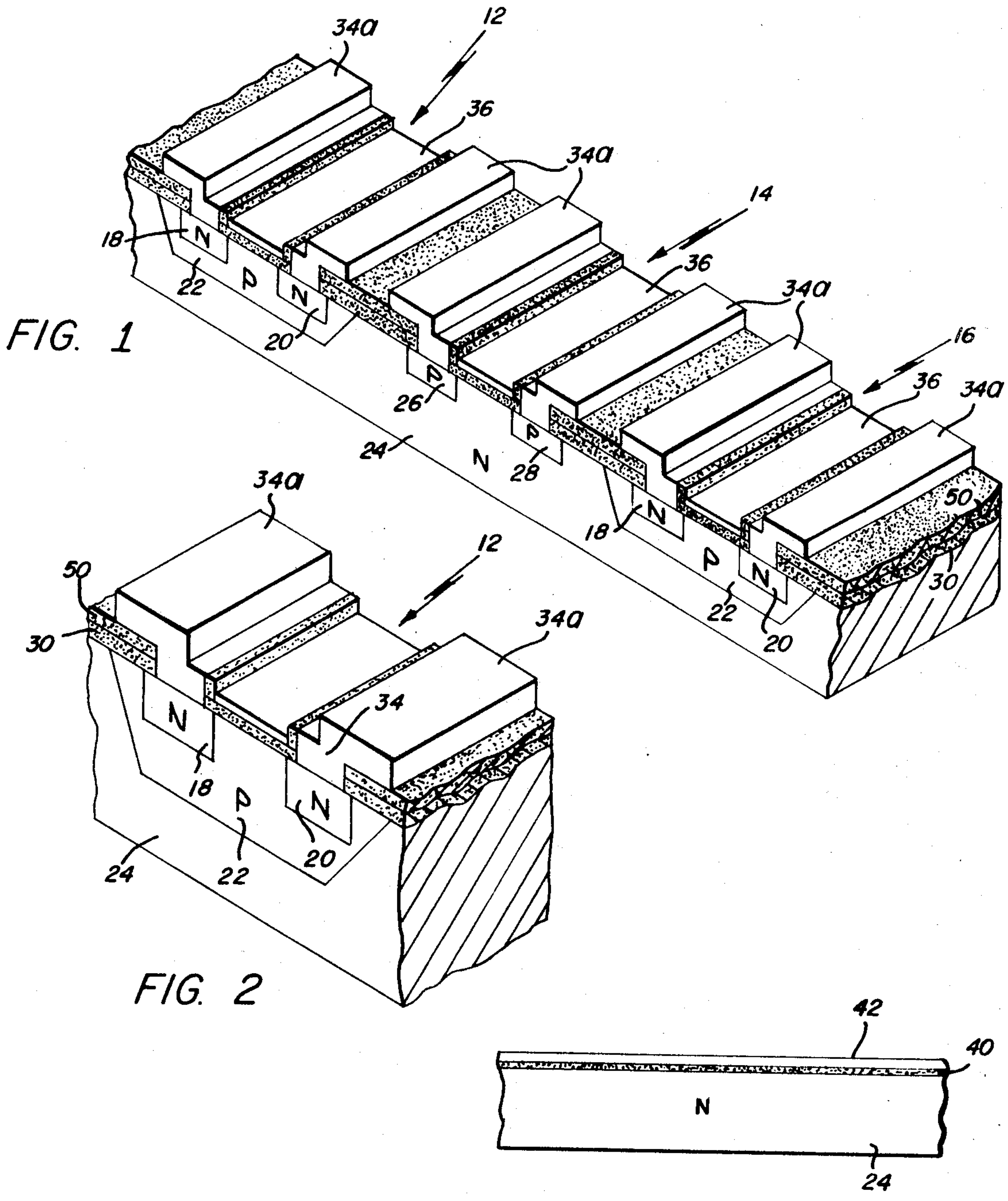
FIG. 1 is an isometric view of a portion of an integrated circuit device embodying this invention.
FIG. 2 is an enlarged isometric view of one of the transistors of the device shown in FIG. 1 further illustrating how contacts to the source and drain regions are made.
FIGS. 3–8 are elevational views illustrating various steps employed in the process of manufacturing the integrated circuit device of the invention.

Referring more particularly to the drawings wherein like characters of reference designate like parts throughout the several views, there is shown in FIG. 1 a view of a portion of an integrated circuit 10 which embodies a number of precisely complementary field-effect transistors. Three such transistors are illustrated in FIG. 1, but it is to be understood that any selected number of transistors may be incorporated in an integrated circuit in accordance with this invention. Each transistor includes spaced source and drain regions of similar conductivity type which are located within a common region of opposite conductivity type. Overlying the space between the source and drain regions of each transistor is a metal gate electrode which is insulatedly spaced from the surface of the device by a layer of insulation such as silicon dioxide.

In FIG. 1, two transistors 12 and 16 each comprise N-type source and drain regions 18 and 20 respectively, the source and drain regions of each transistor being disposed within respective P-regions 22 located within the N-type wafer or chip 24 which forms the matrix for all the transistors in the circuit. Between transistors 12 and 16 is the third transistor 14 which comprises spaced P-type source and drain regions 26–28 which are located directly in the N-type matrix 24.

The surface of the entire wafer is coated with a layer 30 of insulating material such as silicon dioxide or silicon nitride which is provided with suitably shaped apertures therethrough which expose surfaces of the drain and source regions of the multiplicity of transistors. Through these apertures, electrical contacts 34 (FIG. 2) are made to the source and drain regions by means of layers of gold, nickel, aluminum or other selected metal which are deposited within the apertures upon the exposed source and drain region surfaces, and which are each provided with portions **34*a* overlying adjacent portions of the insulating layer 30** so as to provide relatively large or broad contact areas to which leads or interconnections may be easily attached.

Overlying the surface which lies above the area between the source and drain regions is a gate electrode 36 which is spaced from the surface by portions of the oxide layer 30.

The basic matrix layer 24 is shown as N-type conductivity, but it is to be understood that it may be of P-type conductivity if desired, in which case the P-regions 22 and all source and drain regions will be of a conductivity type opposite from that shown in FIG. 1.

P-type conductivity is produced by adding to the semiconductor material during processing a P-type impurity such as boron or indium, while N-type conductivity results from adding to the silicon material an N-type impurity such as antimony, arsenic or phosphorus, as will be described hereinafter. Referring to FIG. 1, the P-regions 22 are epitaxially deposited and the source and drain regions are diffused regions. The insulating layer is deposited or thermally grown silicon dioxide or deposited silicon nitride or other selected material. The metal gates 36 and contacts 34 may be vacuum deposited layers.

In a field effect transistor, when an electric field is applied to the surface, mobile charge carriers within the device are attracted to or repelled from the surface. In the event the field so applied is of adequate magnitude and of proper polarity, the resulting accumulation of carriers near the surface can result in the formation of an inversion layer or channel in which the majority of carriers near the surface is of opposite conductivity type from that in the remainder of the semiconductor body.

Referring now to the single field-effect transistor 12 illustrated in FIG. 2, by applying to the gate 36 of the N-type field-effect transistor a positive potential relative to the substrate 22 equal to or greater than the critical magnitude, an N-type inversion layer or channel now connects the N-diffused source and drain regions 18 and 20 for imparting a source-to-drain conductance thereto. In the complementary P-type device 14, a negative potential is applied to the gate of the critical magnitude to form a P-type inversion layer or channel between the diffused regions 26 and 28 to impart a drain-to-source conductance thereto. The transistor region between the inversion layer and the substrate functions like a P-N junction and remains reverse biased at all times. When the potential applied to a gate is less than the critical value, the impedance between the source and the drain is very high and corresponds to a reverse biased planar silicon dioxide.

The voltage applied to the drain of the field-effect semiconductor devices is of a polarity to reverse bias the diffused junction at the drain contact. Hence, a positive voltage is applied to the drain contact for diffused N-regions and a negative voltage is applied to the drain contact for P-regions.

The field-effect transistors in the circuit device 10 are perfectly complementary since all elements thereof are capable of being precisely duplicated in size, shape and spatial relationship. This is achieved by the novel method of fabrcation to be described.

In the manufacture of an integrated circuit device having a plurality of complementary components therein according to this invention, there is first provided a silicon chip or wafer about 0.010 inch thick which preferably has a resistivity of about 3 ohm/cm. and less than about 2000 dislocations per square centimeter. The crystal ingot from which the wafer is grown is sliced in the 1–0–0 plane, and a flat is ground in the 1–1–0 direction for use in alignment of the wafer in the proper crystallographic orientation for the etch process to be described. The wafer is processed by conventional lapping, polishing, and etching processes to a desired resultant size, such as about six mils thick and one inch in diameter, for example.

The single crystal wafer or chip is suitably doped in any well-known manner to provide it with the selected P- or N-type conductivity characteristics and of such concentration of dopant as will provide the desired resistivity.

The wafer, indicated by numeral 24 in FIG. 3, is depicted herein as being of N-type conductivity by inclusion therein of an N-type impurity such as antimony, arsenic, or phosphorus, but may be of P-type conductivity by including a P-type impurity such as boron or indium, as mentioned before. To prepare the wafer for epitaxial deposition of opposite conductivity type regions, it is coated with a layer 40 of insulating material such as silicon dioxide or silicon nitride. This may be done, for example, by any of the known thermal growing or other oxidation techniques to form the insulating film to a thickness of about two to four (preferably three) microns. Areas to be etched away and later filled with opposite conductivity type material are suitably delineated by any well-known masking technique. For example, the oxide layer 40 is coated with a photoresist material such as the solution known as KPR, sold under that terminology by Eastman-Kodak Company.

It is necessary that openings through the oxide-photoresist layers be provided so as to expose areas of the silicon material which are to be removed by etching, and that these openings be precisely aligned with respect to the 1–1–0 direction of the crystal so that precise etching will occur in accordance with this invention. This is done by first forming a mask in the photoresist 42, which mask is of a predetermined pattern having openings with margins or peripheries perfectly oriented with respect to the 1–1–0 axes. An example of a technique for achieving this is to provide a photographic film with the selected pattern therein and aligning the film over the photoresist in careful registration with respect to the 1–1–0 axes, utilizing the flat which was previously ground into the wafer as an aid for this purpose. The photoresist 42 is exposed through the film to ultraviolet or other radiation to which it is sensitive, and developing then takes place by dipping the wafer in a solution such as trichloroethylene to remove unsensitized KPR. The wafer is then baked at about 150° C. for about ten minutes, whereupon the insulating layer 40 supports thereon a resultant hardened photoresist mask having the desired configuration or pattern.

The insulating material such as silicon dioxide is then removed in the exposed window areas of the photoresist pattern. This is done by placing the wafer in a solution containing about one part of hydrofluoric acid (HF) and nine parts of ammonium fluoride ($NH_4F$) to etch away the exposed areas of silicon dioxide, following which it is rinsed in water and dried. In the case where the insulating material is another material, such as silicon nitride for example, the etchant will be one which is known to remove that material. The remaining photoresist may now be removed if desired by a solution of one part sulphuric acid and nine parts of nitric acid at about 100° C. for about ten minutes. However, the photoresist may be left on if desired because it will be automatically removed in the following etching process. At this point, the insulating coating or layer 40 becomes a mask which is provided with openings having margins which are oriented with respect to the 1–1–0 axes of the crystal.

To etch the exposed surfaces of the wafer, the wafer is placed in a suitable rack and heated in boiling water to preheat it to the temperature of the etching solution, that is, about 80–100° C. The etchant is a saturated solution, i.e., at least 25% of sodium hydroxide (NaOH) in water, preferably in an amount of 33%. The wafer is subjected to the etchant for the time necessary to etch the layer 24 to remove material down to a depth of about ten microns, for example. Etching will take place along the 1–0–0 cleavage planes of the single crystal material as is explained more fully in copending U.S. application Ser. No. 520,506, assigned to the same assignee as the present invention.

Figure 4:
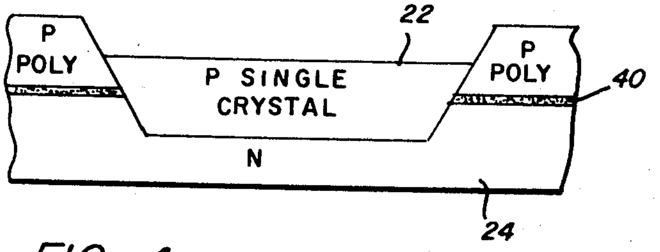

At this stage, the wafer 24 will have a configuration substantially as shown in FIG. 4 wherein the etching process has produced cavities in which the opposite-conductivity-type regions 22 are to be deposited.

The wafer 24 is suitably cleaned and then a P-type layer 22 is epitaxially grown upon the wafer. This is done, for example, by reacting a silicon compound such as silicon tetrachloride, silane or tetraorthosilane in a reducing compound, such as hydrogen for example, in vapor form onto the wafer in a furnace at about 800–1200° C. for about 20 minutes to produce an epitaxial layer 22 which is somewhat thicker than the depth of the cavities in N-layer 24. Layer 22 is simultaneously doped with a P-type impurity in an amount sufficient to provide it with a resistivity of about 3 ohms/cm., for example.

Layer 22 appears at this point as shown in FIG. 4. The portions of layer 22 which overlie the insulating coating 40 are polycrystalline while the portions which are grown directly upon the single crystal material 24 are monocrystalline. A layer (not shown) of photoresist may be applied over the oxide areas only previous to the vapor deposition process to facilitate the formation of uniform polycrystalline silicon on the oxide areas.

After this, the excess silicon in layer 22 is removed so that the exposed surface thereof will be disposed coplanar with the surface of N-layer 24. This may be done by any suitable method such as by polishing the layer 22 with an abrasive which is softer than silicon dioxide. The polishing process thus automatically stops when the silicon dioxide layer 40 is reached. Then layer 40 may be removed with the hydrofluoric acid, after which layer 22 is again polished the slight extent necessary to make the surfaces coplanar, as desired.

Alternatively, the structure shown in FIG. 4 may be treated by first etching out the silicon dioxide layer 40 in hydrofluoric acid, which will thus leave a space between the N-material 24 and the polycrystalline material 22 where the layer 40 previously resided. The etching may be accelerated by heating the etchant, if desired. Then, the layer 22 is polished until its surface is coplanar with the surface of N-layer 24.

The structure is then reoxidized as described above to provide the N- and P-regions with an insulating silicon dioxide layer 42 of suitable thickness such as 0.6 micron, for example. The device at this stage appears substantially as shown in FIG. 5.

From here on, standard techniques can be used for the fabrication of MOS devices or bipolar transistors in the structure. It is preferable that N-type diffusions should be made before the P-type diffusions because N-type impurities used as sopants, such as antimony or arsenic, are slower to diffuse and, thus, must be exposed for a longer time to high temperatures. Therefore, completion of the devices may be achieved by the following briefly described steps.

Figure 5:
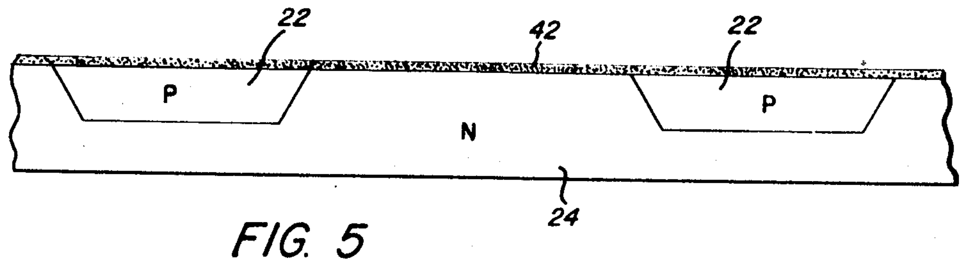
Figure 6:
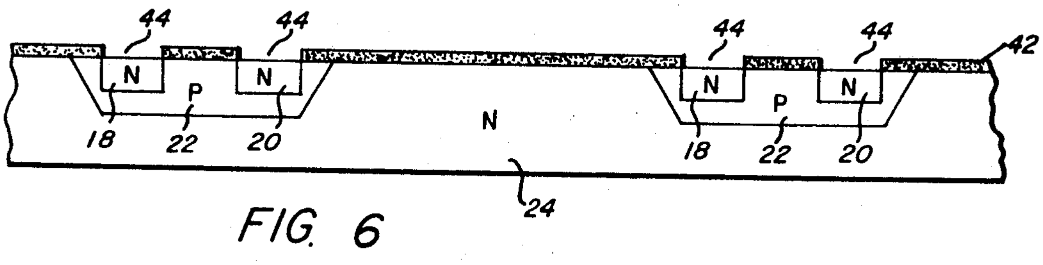
Figure 7:
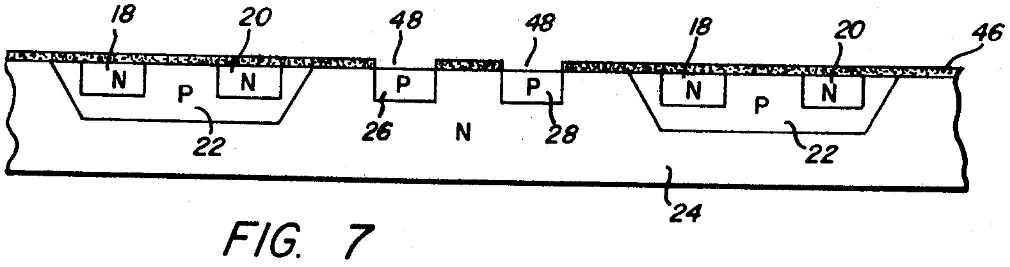
Figure 8:
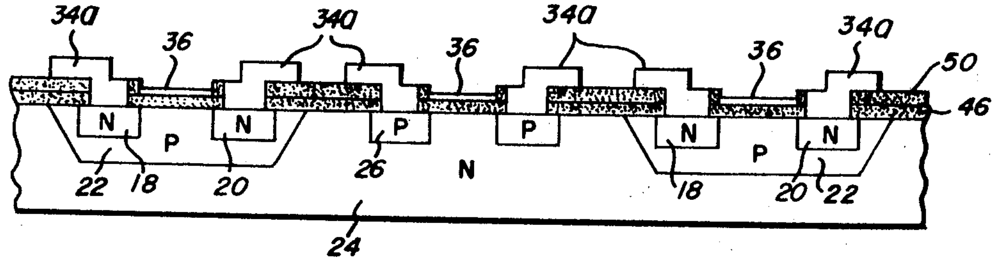

The device shown in FIG. 5 is masked to define, in the oxide layer 30, windows through which N-regions are to be diffused. This may be accomplished by using the photoresist process described hereinbefore to form the selected mask pattern and then etching out the oxide to form windows 44 (FIG. 6). The windows 44 expose spaced surface areas of the previously epitaxially deposited P-regions 22 and it is into these regions 22 that the N-type source and drain regions 18–20 (FIG. 7) are now diffused. This is accomplished by a conventional diffusing process utilizing an N-type dopant such as antimony, arsenic or phosphorus.

After the N-regions 18–20 are made, the silicon dioxide layer 42 is removed, as by hydrofluoric acid, and the device is reoxidized as described hereinbefore to form an insulating layer 46 (FIG. 7) thereon. Then windows 48 are formed in oxide layer 46 to expose spaced surface areas of the N-region 24 between P-regions 22. Then P-type source and drain regions 26–28 are diffused into the N-region 24 through windows 48 in a conventional manner by utilizing a P-type impurity such as boron or indium, as is well known.

Gates are now to be provided over the space between the diodes in each individual pair, and this is done by removing the oxide layer 46 in these regions, such removal being accomplished in a conventional manner, and then depositing another layer 50 of oxide over the entire device. This oxide layer is of controlled thickness, preferably about 1000–6000 angstrom units. However, if desired, layer 46 is allowed to remain and is thereafter adjusted to the proper thickness. Contact areas are then defined in the oxide by photoengraving processes to form windows to expose the various contact surfaces. This device is placed in an evaporator where a layer of about 500 angstrom units of chromium and 7000 angstrom units of gold or other suitable metal is deposited over the wafer. The metal thereafter may be suitably masked and etched to restrict it to the desired areas of the device. This forms the gates 36 and suitable interconnections, not shown. This forms also the metal contacts 34 which are each in physical and electrically conductive contact with a respective drain or source region.

It will be apparent from the foregoing description that a novel integrated circuit device employing a number of complementary field-effect transistors has been achieved. It is to be understood, however, that various changes may be made by those skilled in the art without departing from the spirit of the invention as expressed in the accompany claims.

What is claimed is:

1. The method of making an integrated circuit having a number of complementary semiconductor devices, comprising the steps of providing a substrate of semiconductor material of a first conductivity type with a selected surface aligned in the 1–0–0 crystallographic plane, etching said selected surface substantially along 1–0–0 crystallographic axes normal to said plane to produce therein a number of spaced, precisely shaped cavities of identical configuration and dimensions, filling said cavities with layers of single crystal semiconductor material of opposite conductivity type, forming in each layer a pair of spaced semiconductor regions of said first conductivity type, forming a pair of spaced semiconductor regions of said opposite conductivity type in said surface of the substrate between each pair of adjacent layers, applying metal gate electrodes to said surface of the substrate and layers in insulated relation therewith between the individual semiconductor regions of each pair thereof, and depositing metal contacts on each individual semiconductor region.

2. The method set forth in claim 1 wherein said cavities are filled by epitaxially depositing opposite conductivity type semiconductor material over said surface of the substrate, and thereafter removing excess epitaxially deposited material to render the surfaces of said material in the cavities flush with said surface of the substrate.

References Cited

UNITED STATES PATENTS

| | | | |
|---|---|---|---|
| 3,370,995 | 2/1968 | Lowery et al. | 317—235 |
| 3,423,651 | 1/1969 | Legat et al. | 317—235 |
| 3,425,879 | 2/1969 | Shaw et al. | 317—235 |

OTHER REFERENCES

Electronic Design: "Researchers pusch IC performance higher" by Colen, Nov. 22, 1966, pp. 17, 18, 19.

PAUL M. COHEN, Primary Examiner

U.S. Cl. X.R.

29—577, 578, 589; 156—17; 317—235